United States Patent
Seamons et al.

(10) Patent No.: US 8,536,065 B2
(45) Date of Patent: Sep. 17, 2013

(54) ULTRA HIGH SELECTIVITY DOPED AMORPHOUS CARBON STRIPPABLE HARDMASK DEVELOPMENT AND INTEGRATION

(75) Inventors: Martin Jay Seamons, San Jose, CA (US); Sudha Rathi, San Jose, CA (US); Kwangduk Douglas Lee, Redwood City, CA (US); Deenesh Padhi, Sunnyvale, CA (US); Bok Hoen Kim, San Jose, CA (US); Chiu Chan, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 13/249,794

(22) Filed: Sep. 30, 2011

(65) Prior Publication Data
US 2012/0080779 A1   Apr. 5, 2012

Related U.S. Application Data

(60) Provisional application No. 61/390,087, filed on Oct. 5, 2010.

(51) Int. Cl.
*H01L 21/469* (2006.01)

(52) U.S. Cl.
USPC .............................. 438/761; 438/758; 427/590

(58) Field of Classification Search
USPC ................... 427/490, 122, 249.1, 249.5, 590; 438/761, 758
See application file for complete search history.

(56) References Cited

U.S. PATENT DOCUMENTS

| | | | |
|---|---|---|---|
| 6,424,044 B1 | 7/2002 | Han et al. | |
| 7,064,078 B2 | 6/2006 | Liu et al. | |
| 7,084,071 B1 * | 8/2006 | Dakshina-Murthy et al. | 438/717 |
| 7,312,162 B2 | 12/2007 | Ramaswamy et al. | |
| 7,422,775 B2 | 9/2008 | Ramaswamy et al. | |
| 7,429,532 B2 | 9/2008 | Ramaswamy et al. | |
| 7,576,441 B2 | 8/2009 | Yin et al. | |
| 7,638,440 B2 | 12/2009 | Wang et al. | |
| 7,670,924 B2 | 3/2010 | Demos et al. | |
| 7,718,081 B2 | 5/2010 | Liu et al. | |
| 2004/0087139 A1 | 5/2004 | Yeh et al. | |
| 2004/0259355 A1 * | 12/2004 | Yin et al. | 438/689 |
| 2005/0042879 A1 | 2/2005 | Yin et al. | |

(Continued)

OTHER PUBLICATIONS

Adhikari "Boron-doped hydrogenated amorphous carbon films grown by surface wave mode microwave plasama chemical vapor deposition," Diamond and Related Materials 15, 1909-1912, 2006.*

(Continued)

*Primary Examiner* — Matthew Reames
(74) *Attorney, Agent, or Firm* — Patterson & Sheridan, LLP (57) ABSTRACT

Embodiments of the present invention generally relate to the fabrication of integrated circuits and particularly to the deposition of a boron containing amorphous carbon layer on a semiconductor substrate. In one embodiment, a method of processing a substrate in a processing chamber is provided. The method comprises providing a substrate in a processing volume, flowing a hydrocarbon containing gas mixture into the processing volume, generating a plasma of the hydrocarbon containing gas mixture by applying power from an RF source, flowing a boron containing gas mixture into the processing volume, and depositing a boron containing amorphous carbon film on the substrate in the presence of the plasma, wherein the boron containing amorphous carbon film contains from about 30 to about 60 atomic percentage of boron.

17 Claims, 6 Drawing Sheets

(56) References Cited

U.S. PATENT DOCUMENTS

| | | |
|---|---|---|
| 2005/0056940 A1 | 3/2005 | Sandhu et al. |
| 2005/0064718 A1* | 3/2005 | Yin et al. .................. 438/723 |
| 2005/0202683 A1 | 9/2005 | Wang et al. |
| 2007/0128538 A1 | 6/2007 | Fairbairn et al. |
| 2007/0286954 A1 | 12/2007 | Tang et al. |
| 2009/0286402 A1 | 11/2009 | Xia et al. |

OTHER PUBLICATIONS

International Search Report and Written Opinion dated Apr. 17, 2012 for PCT International Application No. PCT/US2011/054145.

* cited by examiner

ULTRA HIGH SELECTIVITY DOPED AMORPHOUS CARBON STRIPPABLE HARDMASK DEVELOPMENT AND INTEGRATION

CROSS-REFERENCE TO RELATED APPLICATIONS

This application claims benefit of U.S. provisional patent application Ser. No. 61/390,087, filed Oct. 5, 2010, which is herein incorporated by reference.

BACKGROUND OF THE INVENTION

1. Field of the Invention

Embodiments of the present invention generally relate to the fabrication of integrated circuits and particularly to the deposition of a boron containing amorphous carbon layer on a semiconductor substrate.

2. Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photo lithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the pattern dimensions are reduced, the thickness of the energy sensitive resist must correspondingly be reduced in order to control pattern resolution. Such thin resist layers can be insufficient to mask underlying material layers during the pattern transfer step due to attack by the chemical etchant. An intermediate layer (e.g., silicon oxynitride, silicon carbine or carbon film), called a hardmask, is often used between the energy sensitive resist layer and the underlying material layers to facilitate pattern transfer because of its greater resistance to the chemical etchant. It is desirable to have thin hardmasks that have both high etch selectivity and are easy to remove after the etching process is complete. As critical dimensions (CD) decrease, current hardmask materials lack the desired etch selectivity relative to underlying materials and are often difficult to remove.

Therefore, there is a need in the art for an improved hardmask layer and method for depositing improved hardmask layers.

SUMMARY OF THE INVENTION

Embodiments of the present invention generally relate to the fabrication of integrated circuits and particularly to the deposition of a boron containing amorphous carbon layer on a semiconductor substrate. In one embodiment, a method of processing a substrate in a processing chamber is provided. The method includes providing a substrate in a processing volume, flowing a hydrocarbon containing gas mixture into the processing volume, generating a plasma of the hydrocarbon containing gas mixture by applying power from an RF source, flowing a boron containing gas mixture into the processing volume, and depositing a boron containing amorphous carbon film on the substrate in the presence of the plasma, wherein the boron containing amorphous carbon film contains from about 10 to about 60 atomic percentage of boron.

In one another embodiment, a method of processing a substrate in a processing chamber is provided. The method includes exposing a substrate to a flow of a hydrocarbon-containing gas in the presence of RF power to deposit a boron-free amorphous carbon film on the substrate, turning off the RF power while continuing the flow of the hydrocarbon-containing gas, and exposing the substrate to a flow of a boron-containing gas and the flow of the hydrocarbon-containing gas in the presence of RF power to deposit a boron-containing amorphous carbon film on the boron-free amorphous carbon film, wherein the boron-containing amorphous carbon film contains from about 30 to 60 atomic percentage of boron. In one example, the boron-free amorphous carbon film may have a thickness between about 50 Å and about 1000 Å while the boron-containing amorphous carbon film may have a thickness between about 300 Å and about 5000 Å. The boron-containing amorphous carbon film may contain from about 20 to about 50 atomic percentage of carbon and from about 10 to about 25 atomic percentage of hydrogen. The method may further include etching the boron-containing amorphous carbon film to form a patterned boron-containing amorphous carbon film, and forming feature definitions in the substrate corresponding to the patterned boron-containing amorphous carbon film.

In another embodiment, a method of processing a substrate in a processing chamber is provided. The method includes providing a substrate in a processing volume, flowing a hydrocarbon containing gas mixture into the processing volume, generating a plasma of the hydrocarbon containing gas mixture by applying power from an RF source, depositing a boron-free amorphous carbon film on the substrate in the presence of the plasma, flowing a boron containing gas mixture into the processing volume, and depositing a boron containing amorphous carbon film on the boron free amorphous carbon containing film in the presence of the plasma, wherein the boron containing amorphous carbon film contains from about 10 to about 60 atomic percentage of boron.

In one another embodiment, a method of processing a substrate in a processing chamber is provided. The method includes providing a substrate in a processing chamber, flowing a hydrocarbon-containing gas mixture into the processing chamber, generating a first plasma from the hydrocarbon-containing gas mixture to deposit a boron-free amorphous carbon film on the substrate, the boron-free amorphous carbon film having a thickness between about 300 Å and about 5000 Å, stabilizing a processing condition within the processing chamber by turning off the first plasma while continuing the flow of the hydrocarbon-containing gas mixture into the processing chamber, flowing a boron-containing gas mixture into the processing chamber, and generating a second plasma from the hydrocarbon-containing gas mixture and the boron-containing gas mixture to deposit a boron-containing amorphous carbon film on the boron-free amorphous carbon film, the boron-containing amorphous carbon film having a thickness between about 300 Å and about 5000 Å. In one example, the boron-containing amorphous carbon film may contain from about 10 to about 60 atomic percentage of boron. The method may further include removing the boron-containing amorphous carbon film using a solution comprising hydrogen peroxide and sulfuric acid, and removing the boron-free amorphous carbon film using a hydrogen-containing plasma, an oxygen-containing plasma, or combinations thereof.

In yet another embodiment, a boron containing amorphous carbon film is provided. The boron containing amorphous carbon film contains from about 10 to about 60 atomic percentage of boron, from about 20 to about 50 atomic percentage of carbon, and from about 10 to about 30 atomic percentage of hydrogen.

In yet one another embodiment, a semiconductor device is provided. The device includes a boron-free amorphous carbon film deposited over a substrate, the boron-free amorphous carbon film having a thickness between about 50 Å and about 5000 Å, a boron-containing amorphous carbon film deposited on the boron-free amorphous carbon film, wherein the boron-containing amorphous carbon film having a thickness between about 300 Å and about 5000 Å and containing from about 10 to 60 atomic percentage of boron, an anti-reflective coating film deposited on the boron-containing amorphous carbon film, and a photoresist film deposited on the anti-reflective coating film.

In one another embodiment, a method of processing a substrate in a processing chamber is provided. The method includes exposing a substrate to a flow of a gas mixture comprising a hydrocarbon-containing gas and a boron-containing gas in the presence of RF power to deposit a boron-containing amorphous carbon film over the substrate, etching the boron-containing amorphous carbon film to form a patterned boron-containing amorphous carbon film, wherein the boron-containing amorphous carbon film contains from about 35 to about 60 atomic percentage of boron and has a thickness between about 300 Å and about 5000 Å, and forming feature definitions in the substrate corresponding to the patterned boron-containing amorphous carbon film. In one example, the boron-containing amorphous carbon film may contain from about 20 to about 50 atomic percentage of carbon and from about 10 to about 25 atomic percentage of hydrogen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally relate to the fabrication of integrated circuits and particularly to the deposition of an amorphous carbon layer on a semiconductor substrate, more particularly, to the deposition of a boron-containing amorphous carbon layer. High aspect ratio etches for deep contacts in logic and memory device structures may have aspect ratios from 10-75:1 where the hard mask is 10 to 40% of the total stack thickness. In one embodiment, a boron-containing amorphous carbon film that improves etch selectivity by 40 to 80% which would permit reducing the hardmask thickness by a similarly corresponding amount is provided. In another embodiment, a boron-containing film that is two to twenty times more etch resistant than currently know undoped amorphous carbon films allowing for a reduction in hardmask thickness and aspects of the structures is provided. Certain embodiments described herein improve the hardmask profile, critical dimension control and critical dimension uniformity. In various embodiments, the boron-containing amorphous carbon layer may be deposited using a hydrocarbon-containing gas, boron-containing gas, and inert/carrier gas such as argon, nitrogen, and helium. Advantageously, it has been found that the boron-containing amorphous carbon film may be easily stripped from underlying materials using industry accepted wet etch chemistry without damaging underlying dielectric films.

Embodiments of the present invention also provide a multi-layer hardmask comprising an amorphous carbon layer and a boron-containing amorphous carbon layer deposited on the amorphous carbon layer. In one embodiment, the boron-containing amorphous carbon film contains from about 10 to about 60 atomic percentage of boron. The thickness of the amorphous carbon layer may vary ranging between about 50 Å and about 5000 Å. The boron-containing amorphous carbon film may have a thickness between about 300 Å and about 5000 Å. In cases where the amorphous carbon layer has a thickness of about 50 Å to about 1000 Å, the underlying amorphous carbon layer may serve as a transition layer between the substrate and the boron-containing amorphous carbon layer to avoid formation of amorphous boron (difficult to remove) directly on the substrate during the subsequent boron-containing amorphous carbon deposition using a boron-containing gas such as diborane. In addition to serving as a transition film, in certain embodiments where the amorphous carbon layer has a thickness of about 300 Å to about 5000 Å the boron-containing amorphous carbon layer can be consumed during the main etch process with excellent hardmask performance (e.g., good CD control and feature profile) while having thick enough amorphous carbon layer, which is easily ashable using conventional oxygen plasma, left underneath to complete the patterning without damaging underlying layers. It should be appreciated by those skilled in the art that the term "boron-containing amorphous carbon" used throughout the specification generally covers boron carbon (borocarbon) materials, either in the boron carbide form or in non-stoichiometric mixtures of boron and carbon, or amorphous carbon doped with boron. It should be also noted that while the material is referred to herein as "amorphous," this term is not intended to signify the complete absence of a crystalline structure in the film but instead indicates only that no crystalline structure is discernible by the presently available techniques.

Figure 1:
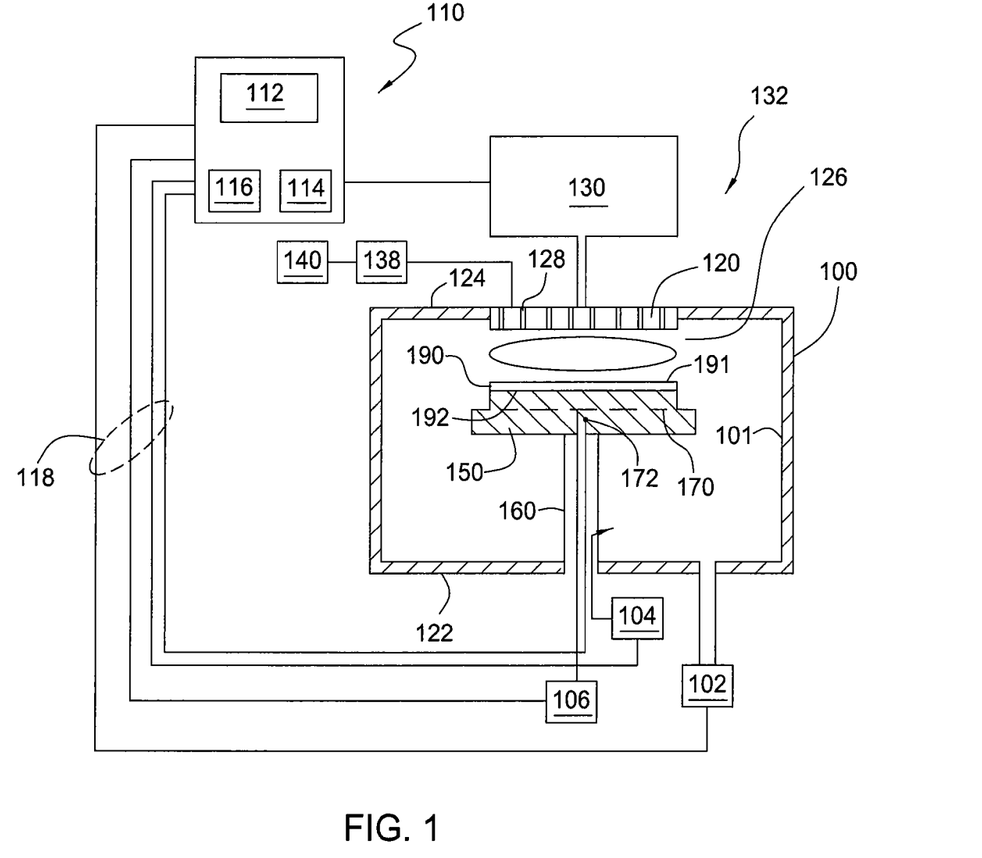
FIG. 1 depicts a schematic illustration of an apparatus that can be used for the practice of embodiments described herein.

FIG. 1 depicts a schematic illustration of a substrate processing system 132 that can be used to perform amorphous carbon layer deposition in accordance with embodiments described herein. Details of one example of a substrate processing system 132 that may be used to practice the invention is described in commonly assigned U.S. Pat. No. 6,364,954 issued on Apr. 2, 2002, to Salvador et. al. and is herein incorporated by reference. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing system, including those available from other manufacturers, may be adapted to practice the embodiments described herein.

The processing system 132 includes a process chamber 100 coupled to a gas panel 130 and a controller 110. The process chamber 100 generally includes a top 124, a side 101 and a bottom wall 122 that define an interior processing volume 126. A support pedestal 150 is provided in the interior processing volume 126 of the chamber 100. The pedestal 150 is supported by a stem 160 and may be typically fabricated from aluminum, ceramic, and other suitable materials. The pedestal 150 may be moved in a vertical direction inside the chamber 100 using a displacement mechanism (not shown).

The pedestal 150 may include an embedded heater element 170 suitable for controlling the temperature of a substrate 190 supported on a surface 192 of the pedestal 150. The pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition. The supplied electric current may be adjusted to selectively control the temperature of the pedestal 150 between about 100 degrees Celsius to about 700 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

A vacuum pump 102 is coupled to a port formed in the bottom of the chamber 100. The vacuum pump 102 is used to maintain a desired gas pressure in the process chamber 100. The vacuum pump 102 also evacuates post-processing gases and by-products of the process from the chamber 100.

The processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior processing volume 126 during process. A plasma is formed from the process gas mixture exiting the showerhead 120 to enhance thermal decomposition of the process gases resulting in the deposition of material on a surface 191 of the substrate 190.

The showerhead 120 and substrate support pedestal 150 may form a pair of spaced apart electrodes in the interior processing volume 126. One or more RF power sources 140 provide a bias potential through a matching network 138 to the showerhead 120 to facilitate generation of plasma between the showerhead 120 and the pedestal 150. Alternatively, the RF power sources 140 and matching network 138 may be coupled to the showerhead 120, substrate pedestal 150, or coupled to both the showerhead 120 and the substrate pedestal 150, or coupled to an antenna (not shown) disposed exterior to the chamber 100. In one embodiment, the RF power sources 140 may provide between about 100 Watts and about 3,000 Watts at a frequency of about 50 kHz to about 13.6 MHz. In another embodiment, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Other deposition chambers may also benefit from the present invention and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc. In one embodiment, the boron-containing amorphous carbon layer may be deposited using a PRODUCER SE™ or PRODUCER GT™ processing chamber which are commercially available from Applied Materials, Inc., Santa Clara, Calif. using the parameters set forth in Table I below.

The quantity/percentage of boron in the as-deposited boron-containing amorphous carbon film may vary from application to application. In various embodiments of the present invention, the boron-containing amorphous carbon film may contain at least 8, 10, 15, 20, 25, 30, 35, 40, 45, 50 or 55 atomic percentage of boron. The boron-containing amorphous carbon film may contain up to 15, 20, 25, 30, 35, 40, 45, 50, 55, or 60 atomic percentage of boron. The boron-containing amorphous carbon film may contain from about 10 to about 60 atomic percentage of boron. The boron-containing amorphous carbon film may contain from about 30 to about 60 atomic percentage of boron. The boron-containing amorphous carbon film may contain at least 15, 20, 25, 30, 35, 40, 45, 50, 55, or 60 atomic percentage of carbon. The boron-containing amorphous carbon film may contain up to 25, 30, 35, 40, 45, 50, 55, 60, or 65 atomic percentage of carbon. The boron-containing amorphous carbon film may contain from about 20 to about 65 atomic percentage of carbon, for example about 35 to about 50 atomic percentage of carbon. The boron-containing amorphous carbon film may contain at least 10, 15, 20, 25 atomic percentage of hydrogen. The boron-containing amorphous carbon film may contain up to 15, 20, 25, 30, or 40 atomic percentage of hydrogen. The boron-containing amorphous carbon film may contain from about 10 to about 25 atomic percentage of hydrogen. In certain embodiments where nitrogen is used as a precursor, the boron-containing amorphous carbon film may contain at least 5, 10, or 15 atomic percentage of nitrogen. The boron-containing amorphous carbon film may contain up to 10, 15, or 20 atomic percentage of nitrogen.

In general, the following exemplary deposition process parameters may be used to form the boron-containing amorphous carbon layer. The process parameters may range from a wafer temperature of about 100° C. to about 700° C., for example, between about 200° C. to about 500° C. The chamber pressure may range from a chamber pressure of about 1 torr to about 20 torr, for example, between about 2 Torr and about 10 Torr. The flow rate of the hydrocarbon containing gas may be from about 200 sccm to about 5,000 sccm, for example, between about 400 sccm and about 2,000 sccm. The flow rate of a dilution gas may individually range from about 0 sccm to about 20,000 sccm, for example from about 2,000 sccm to about 10,000 sccm. The flow rate of an inert gas may individually range from about 0 sccm to about 20,000 sccm, for example from about 200 sccm to about 2,000 sccm. The flow rate of the boron-containing gas mixture may be from about 1,000 sccm to about 15,000 sccm, for example, between about 5,000 sccm and about 13,000 sccm. An RF power of between about 1 W/in² and about 100 W/in², such as between about 3 W/in² and about 20 W/in², and a plate spacing of between about 200 mils to about 600 mils between the top surface of the substrate and the showerhead. The boron-containing amorphous carbon layer may be deposited to a thickness between about 100 Å and about 20,000 Å, such as between about 300 Å to about 5000 Å. The above process parameters provide a typical deposition rate for the boron-containing amorphous carbon layer in the range of about 100 Å/min to about 10,000 Å/min and can be implemented on a 300 mm substrate in a deposition chamber available from Applied Materials, Inc. of Santa Clara, Calif.

TABLE I

| Deposition Parameter | Exemplary Range | |
|---|---|---|
| Temperature (° C.) | 200-550° C. | 400° C. |
| Pressure (Torr) | 2.0-10.0 Torr | 7.0 Torr |
| RF Power (13.56 MHz) | 100-3,000 Watts | 1,200 Watts |
| Spacing | 200-600 mils | 320 mils |
| $C_2H_2$ flow | 200-2,000 sccm | 500 sccm |
| He flow | 0-10,000 sccm | 400 sccm |
| $B_2H_6$ mixture flow | 1,000-15,000 sccm | 13,000 sccm |
| Ar flow | 0-10,000 sccm | 3,000 sccm |

The as-deposited boron-containing amorphous carbon film may have a uniformity (R/2%) of less than 2.0%. The as-deposited boron-containing amorphous carbon film may have a refractive index (RI (633 nm)) of greater than 1.8, for example approximately 2.32. The as-deposited boron-containing amorphous carbon film may have a k value (K (at 633 nm)) of less than 0.1, for example, approximately 0.02. The as-deposited boron-containing amorphous carbon film may have a stress (MPa) of from about 0 to about −500 MPa, for example −50 MPa. The as-deposited boron-containing amorphous carbon film may have a density (g/cc) of greater than 1.5 g/cc, for example approximately 1.86 g/cc or higher such as 1.95 g/cc.

Figure 2:
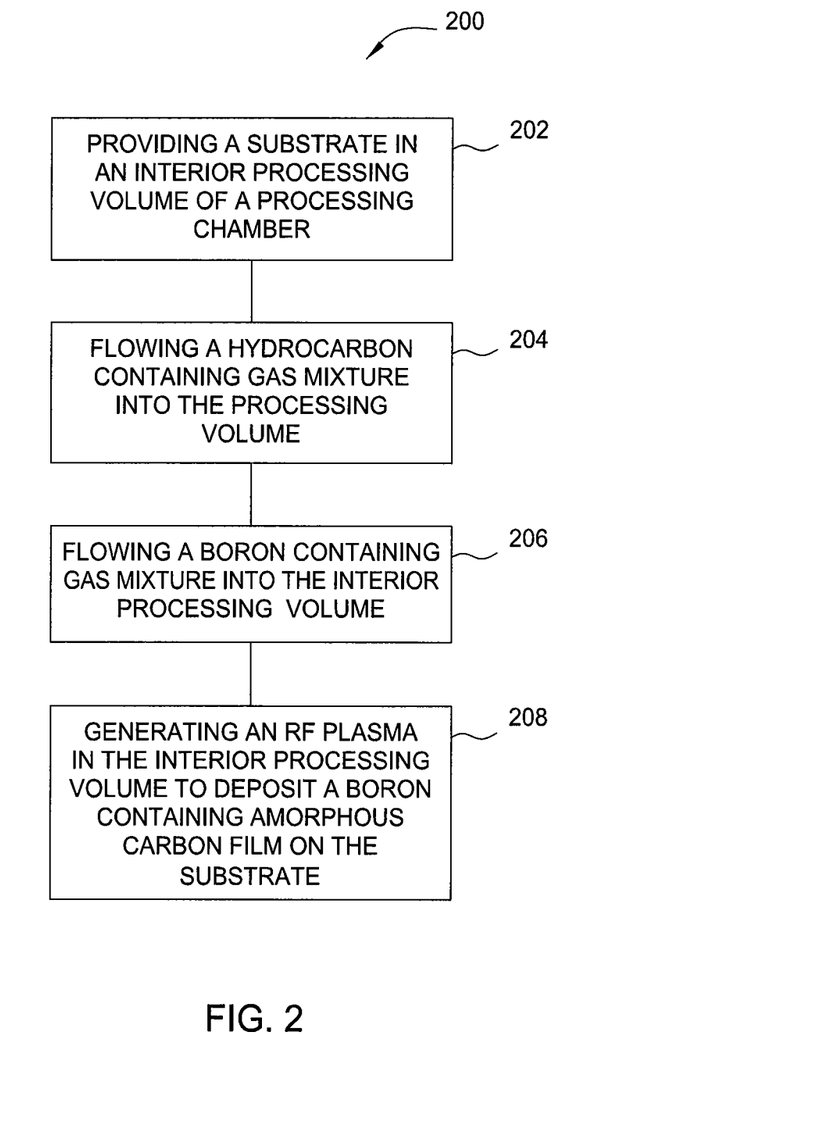
FIG. 2 is a process flow diagram depicting one embodiment of a method for depositing a boron containing amorphous carbon film according to embodiments described herein.
Figure 3:
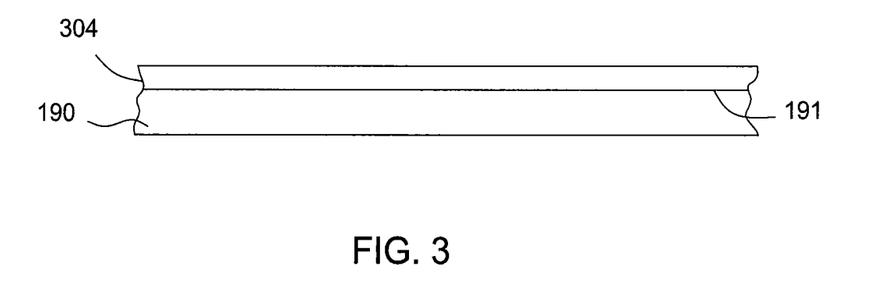
FIG. 3 depicts a schematic cross-sectional view of a substrate structure incorporating a boron containing amorphous carbon layer as a hardmask layer according to embodiments described herein.

FIG. 2 is a process flow diagram depicting one embodiment of a method 200 for depositing a boron-containing amorphous carbon film according to embodiments described herein. The method 200 begins at block 202 by providing a substrate in an interior volume of a processing chamber. The processing chamber may be the processing chamber 100 depicted in FIG. 1. The substrate 190, as shown in FIG. 3, has a substantially planar surface 191. Alternatively, the substrate 190 may have patterned structures, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application. In one embodiment where a memory application is desired, the substrate 190 may include the silicon substrate material, an oxide material, and a nitride material, with or without polysilicon sandwiched in between. In another embodiment, the substrate 190 may include a plurality of alternating oxide and nitride materials (i.e., oxide-nitride-oxide (ONO)) deposited on a surface of the substrate (not shown). In various embodiments, the substrate 190 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon. The substrate may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At block 204, a hydrocarbon containing gas mixture is flowed into the processing volume 126. The hydrocarbon containing gas mixture may be flowed from the gas panel 130 into the processing volume 126 through the showerhead 120. The gas mixture may include at least one hydrocarbon compound and an inert gas. The hydrocarbon can be any liquid or gas, though the preferred precursor would be vapor at room temperature to simplify the hardware required for material metering, control and delivery to the chamber. Preferably, the carbon source is a gaseous hydrocarbon, such as a linear hydrocarbon. In one embodiment, the hydrocarbon compound has a general formula $C_xH_y$, where x has a range of between 1 and 20 and y has a range of between 1 and 20. Suitable hydrocarbon compounds include one or more of the following compounds, for example, alkanes methane ($CH_4$), ethane ($C_2H_6$), propylene ($C_3H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentane, 3-methylpentane, 2,3-dimethylbutane, and 2,2-dimethyl butane, and so on. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Also, alkynes such as acetylene ($C_2H_2$), propyne ($C_3H_4$), butylene ($C_4H_8$), vinylacetylene and derivatives thereof can be used as carbon precursors. Additionally aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like can be used. In one example, $C_2H_2$ is preferable due to formation of more stable intermediate species which allows more surface mobility.

Suitable dilution gases such as helium (He), argon (Ar), hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. In some cases, the addition of $N_2$ and/or $NH_3$ can be used to control the hydrogen ratio of the amorphous carbon layer, as discussed below. Alternatively, dilution gases may not be used during the deposition.

The inert gas, such as argon (Ar) and/or helium (He) may be supplied with the hydrocarbon containing gas mixture into the process chamber 100. Other inert gases, such as nitrogen ($N_2$) and nitric oxide (NO), may also be used to control the density and deposition rate of the amorphous carbon layer. Additionally, a variety of other processing gases may be added to the gas mixture to modify properties of the amorphous carbon material. In one embodiment, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited amorphous carbon layer. The hydrogen ratio present in the amorphous carbon film provides control over layer properties, such as reflectivity.

At block 206, a boron-containing gas mixture is flowed into the interior processing volume 126. The boron-containing gas mixture may be flowed from the gas panel 130 into the processing volume 126 through the showerhead 120. In one embodiment, the boron-containing gas mixture comprises a boron-containing compound and an inert gas. Examples of boron-containing compounds include diborane ($B_2H_6$), trimethyl boron (TMB or $B(CH_3)_3$), triethylboron (TEB), methyl boron, dimethyl boron, ethyl boron, diethyl boron, and similar compounds. In one embodiment, the percentage of boron-containing compound in the total boron-containing gas mixture is from about 2% to about 20%. In another embodiment, the percentage of boron-containing compound in the total boron-containing gas mixture is from about 5% to about 10%. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, or 5% $B_2H_6$/95% $H_2$. Not to be limited by theory but it has been found by the inventors that the use of helium achieves improved mechanical film properties such as modulus and hardness rather than the use of nitrogen. It is contemplated that when different concentrations of boron-containing gas mixtures are used, the flow rate required to achieve certain film properties may change accordingly. For example in case where 5% diborane is used as the boron-containing gas source, the flow rate of the boron-containing gas mixture may be from about 5,000 sccm to about 15,000 sccm, for example, about 13,000 sccm. In one another example where 10% diborane is used as the boron-containing gas source, the flow rate of the boron-containing gas mixture may be from about 4,000 sccm to about 10,000 sccm, for example about 6,000 sccm to about 7,000 sccm.

At block 208, an RF plasma is generated in the interior processing volume 126 to deposit a boron-containing amorphous carbon film 304 on the substrate 190. FIG. 2 herein shows one embodiment where the hydrocarbon containing gas mixture and the boron-containing gas mixture are introduced into the interior processing volume 126 before turning on the RF plasma. In such a case, the hydrocarbon containing gas mixture may be introduced into the processing volume 126 for a longer time such as between about 5 seconds and about 30 seconds, for example about 15 seconds, which may vary depending upon the size of the substrate. The flowing of the hydrocarbon containing gas mixture prior to the introduction of the boron-containing gas is believed to provide continuous thermal and pressure stabilization of the processing volume 126. While flowing the hydrocarbon containing gas mixture, the boron-containing gas mixture is then flowing into the processing volume 126 about 0.5 seconds to about 5 seconds, for example about 1 seconds to about 2 seconds (the flowing time may vary as long as the flow is just long enough for the boron-containing gas mixture to start reaching the processing volume 126) prior to striking the RF plasma. The hydrocarbon containing gas mixture and the boron-containing gas mixture may continue flow until a desired thickness of the boron-containing amorphous carbon film 304 is reached. Alternatively, the RF plasma may be generated prior to introduction of the boron-containing gas mixture into the interior processing volume 126.

The thickness of the boron-containing amorphous carbon film 304 is variable depending upon the stage of processing. In one embodiment, the boron-containing amorphous carbon film 304 may have a thickness from about 100 Å to about 20,000 Å, for example about 300 Å to about 5,000 Å. The boron-containing amorphous carbon film 304 may be patterned using a standard photoresist patterning techniques.

The boron-containing amorphous carbon film 304 may be removed using a solution comprising hydrogen peroxide and sulfuric acid. One exemplary solution comprising hydrogen peroxide and sulfuric acid is known as Piranha solution or Piranha etch. The boron-containing amorphous carbon film 304 may also be removed using etch chemistries containing oxygen and halogens (e.g. fluorine or chlorine), for example, $Cl_2/O_2$, $CF_4/O_2$, $Cl_2/O_2/CF_4$.

Figure 4:
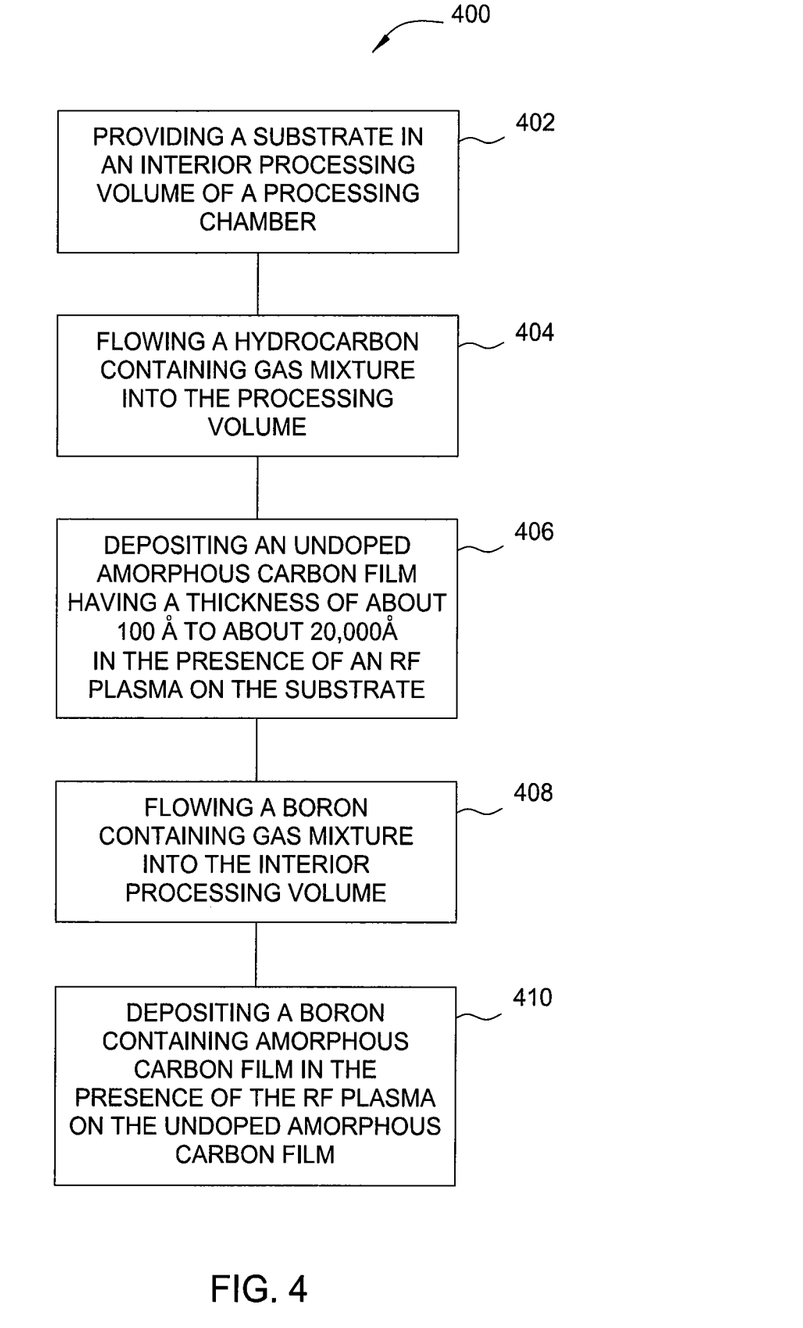
FIG. 4 is a process flow diagram depicting one embodiment of a method for depositing a boron containing amorphous carbon film according to embodiments described herein.
Figure 5:
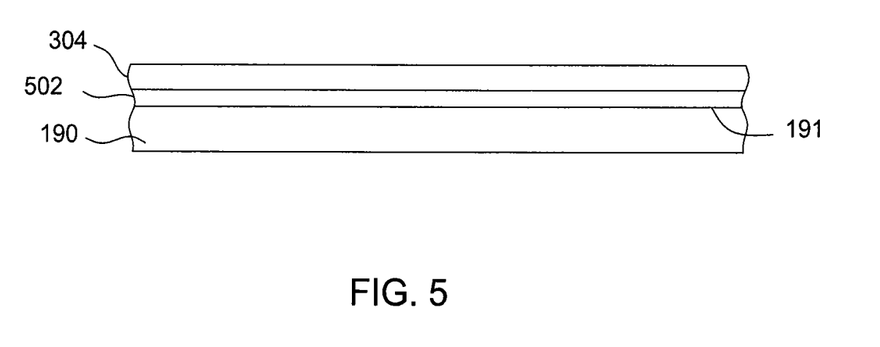
FIG. 5 depicts a schematic cross-sectional view of a substrate structure incorporating a boron containing amorphous carbon layer as a hardmask layer over an undoped amorphous carbon film according to embodiments described herein.

FIG. 4 is a process flow diagram depicting one embodiment of another method 400 for depositing a boron-containing amorphous carbon film according to embodiments described herein. FIG. 5 depicts a schematic cross-sectional view of a substrate structure incorporating a boron-containing amorphous carbon film 304 as a hardmask layer on an undoped amorphous carbon film 502 according to embodiments described herein. The method 400 depicted in FIG. 4 is similar to the method 200 depicted in FIG. 2 except that the an undoped amorphous carbon film 502 is deposited on the surface 191 of the substrate 190 prior to deposition of the boron-containing amorphous carbon film 304 on the undoped amorphous carbon film 502.

At block 402 a substrate 190 is positioned in an interior processing volume 126 of a processing chamber 100.

At block 404, a hydrocarbon containing gas mixture is flowed into the interior processing volume 126. The hydrocarbon containing gas mixture may be similar to the hydrogen containing gas mixture used in method 200.

At block 406, an RF plasma is generated in the interior processing volume 126 to deposit an undoped amorphous carbon (boron-free) film on the surface 191 of the substrate 190. The undoped amorphous carbon film 502 may be deposited using the aforementioned processing conditions without the flow of the boron-containing gas mixture. In one embodiment, the undoped amorphous carbon film 502 may have a thickness of about 50 Å to about 1,000 Å, which can serve as a transition layer between the substrate 190 and a subsequently deposited boron-containing amorphous carbon film 304 (FIG. 5). It has been observed that during the subsequent deposition of the boron-containing amorphous carbon film 304, the boron-containing gas (such as diborane) used as the boron source is decomposed and forms an amorphous boron film (which is difficult to remove) on the heated substrate even without turning on the plasma. The undoped amorphous carbon film 502 as deposited avoids the formation of amorphous boron directly on the substrate during the subsequent boron-containing amorphous carbon deposition.

In another embodiment, the undoped amorphous carbon layer 502 may have a thicker thickness of about 300 Å to about 5000 Å, for example about 2000 Å to about 3000 Å, such that the subsequent boron-containing amorphous carbon film 304 to be deposited on the undoped amorphous carbon layer 502 (FIG. 5) can be consumed during the main etch process with excellent hardmask performance (e.g., good CD control and feature profile) while having thick enough amorphous carbon layer, which is easily ashable using conventional oxygen plasma, left underneath to complete the patterning without damaging underlying layers. This multi-layer hardmask approach may be applied to various applications such as deep oxide contact etches, DRAM capacitor mold etches, and line and/or space etches. In the case of the line and space etch applications such as shallow trench isolation etch hardmask, gate etch hardmask and bitline etch hardmask, the film stack may have about 300 Å to about 1,000 Å of the undoped amorphous carbon film 502 and about 300 Å to about 1,000 Å of the boron-containing amorphous carbon film 304. Depending upon the etch selectivity of the dense and isolated regions, the thickness of the layers may be tuned.

Once the undoped amorphous carbon film 502 with a desired thickness is deposited on the substrate 190, the processing chamber may be stabilized by turning off the RF plasma while continuing the flow of the hydrocarbon containing gas mixture into the process volume 126. The RF plasma may be resumed after introduction of the boron-containing gas mixture into the processing volume 126. In one example, the boron-containing gas mixture is flowing into the processing volume 126 about 0.5 seconds to about 5 seconds, for example about 1 seconds to about 2 seconds (the flowing time may vary as long as the flow is just long enough for the boron-containing gas mixture to start reaching the processing volume 126) prior to striking the RF plasma.

After deposition of the undoped amorphous carbon film 502, at block 408, a boron-containing gas mixture, similar to the boron-containing gas mixture used in method 200 is flowed into the interior processing volume 126 of the processing chamber. In one embodiment, the processing conditions used for deposition of the undoped amorphous carbon film 502 may be maintained while flowing the boron-containing gas mixture into the interior processing volume 126 of the processing chamber 100. Alternatively, the RF plasma may be turned off while continuing the flow of the hydrocarbon containing gas mixture into the process volume 126 prior to introduction of the boron-containing gas mixture into the interior processing volume 126 as discussed above.

At block 410, a boron-containing amorphous carbon film 304 is deposited in the presence of the RF plasma on the undoped amorphous carbon film 502. In one embodiment, the boron-containing amorphous carbon film 304 may have a thickness from about 100 Å to about 20,000 Å, for example about 300 Å to about 5,000 Å. The boron-containing amorphous carbon film 304 as deposited provides superior resistance to mask faceting, which is important in maintaining CD control and feature profile during main etching process, and excellent etch selectivity based on blanket film testing up to 7× better than the conventional amorphous carbon hardmasks. The boron-containing amorphous carbon film 304 may be removed using a solution comprising hydrogen peroxide and sulfuric acid. One exemplary solution comprising hydrogen peroxide and sulfuric acid is known as Piranha solution or Piranha etch. The undoped (boron-free) amorphous carbon film 502 may be removed using hydrogen-containing plasma, an oxygen-containing plasma, or combinations thereof. The boron-containing amorphous carbon film 304 may also be removed using etch chemistries containing oxygen and halogens (e.g. fluorine or chlorine), for example, $Cl_2/O_2$, $CF_4/O_2$, $Cl_2/O_2/CF_4$.

The following non-limiting examples are provided to further illustrate embodiments described herein. However, the examples are not intended to be all inclusive and are not intended to limit the scope of the embodiments described herein. The exemplary films depicted in Tables II and IV were deposited using the PRODUCER SE™ processing chamber which is commercially available from Applied Materials, Inc., Santa Clara. Table II depicts the process conditions and mechanical properties for boron-containing amorphous carbon films (samples 2-9) according to embodiments described herein. Sample 1 is a control which does not contain boron. Table III depicts the percentage of carbon, hydrogen, boron, and nitrogen in the as-deposited films for samples 1-9 depicted in Table II. The atomic percentage (at. %) has the following uncertainty (at. %) and detection limit (at. %) respectively for each element: O (±3, 3), N (±3, 3), C (±4, 4), B (±5, 4), and H (±4, 4). The units for Stress are MPa, the units for density are g/cc, the units for flow rates are sccm, the units for spacing are mils, the units for pressure are Torr, the units for thickness are in A, the units for deposition rate are A/minute, and the units for temperature are degrees Celsius.

TABLE II

| Sample # | Temp | HF | Press | Spacing | C2H2 | He | B2H6 | Ar | k at 633 | Density | Stress |
|---|---|---|---|---|---|---|---|---|---|---|---|
| 1 | 400 | 1400 | 3.5 | 310 | 600 | 400 | 0 | 14000 | 0.3171 | 1.6103 | −414 |
| 2 | 400 | 1400 | 3.5 | 310 | 600 | 400 | 1400 | 14000 | 0.5026 | 1.6103 | −207 |
| 3 | 400 | 1400 | 3.5 | 310 | 600 | 400 | 2500 | 14000 | 0.4714 | 1.6811 | −230 |
| 4 | 400 | 1400 | 3.5 | 310 | 600 | 400 | 4500 | 14000 | 0.2855 | 1.8272 | −333 |
| 5 | 400 | 1680 | 5 | 320 | 500 | 400 | 5000 | 0 | 0.174 | 1.717 | −103 |
| 6 | 400 | 1680 | 5 | 320 | 500 | 400 | 9000 | 0 | 0.0401 | 1.9408 | −162 |
| 7 | 400 | 1400 | 3.5 | 310 | 600 | 400 | 1400 | 14000 | 0.3239 | 1.604 | −330 |
| 8 | 400 | 1400 | 3.5 | 310 | 600 | 400 | 2500 | 14000 | 0.1601 | 1.6103 | −263 |
| 9 | 400 | 1400 | 3.5 | 310 | 600 | 400 | 4500 | 14000 | 0.1033 | 1.6103 | −205 |

TABLE III

| Sample # | % C | % H | % B | % N |
|---|---|---|---|---|
| 1 | 64.5 | 35.5 | | |
| 2 | 71.2 | 28.8 | | |
| 3 | 66.6 | 25.4 | 8 | |
| 4 | 50.5 | 27.5 | 22 | |
| 5 | 50 | 31 | 19 | |
| 6 | 40.2 | 23.5 | 36.3 | |
| 7 | 65 | 26.5 | 8.5 | |
| 8 | 44.5 | 28.4 | 15.1 | 12 |
| 9 | 36.8 | 26.2 | 22 | 15 |

Table IV depicts the process conditions and mechanical properties for boron-containing amorphous carbon films (samples 10-16) according to embodiments described herein. Table V depicts the percentage of carbon, hydrogen, boron, and nitrogen in the as-deposited films for samples 10-16 depicted in Table IV. The atomic percentage (at. %) has the following uncertainty (at. %) and detection limit (at. %) respectively for each element: O (±3, 3), N (±3, 3), C (±4, 4), B (±5, 4), and H (±5, 0.3).

TABLE IV

| | Temp | HF | Press | Spacing | C3H6 | C2H2 | He | B2H6 |
|---|---|---|---|---|---|---|---|---|
| 10 | 400 | 1400 | 7 | 320 | 0 | 500 | 400 | 5000 |
| 11 | 400 | 1400 | 7 | 320 | 0 | 500 | 400 | 9000 |
| 12 | 400 | 1400 | 7 | 320 | 0 | 500 | 400 | 13000 |
| 13 | 480 | 1400 | 7 | 320 | 0 | 500 | 400 | 3000 |
| 14 | 480 | 1400 | 7 | 320 | 0 | 500 | 400 | 7000 |
| 15 | 480 | 1400 | 7 | 320 | 0 | 500 | 400 | 13000 |
| 16 | 400 | 1680 | 5 | 320 | 0 | 500 | 400 | 9000 |

| | Ar | Time | Thick | DR | n 633 | k 633 | Stress | Density |
|---|---|---|---|---|---|---|---|---|
| 10 | 3000 | 30 | 1650 | 3301 | 2.35 | 0.123 | −342 | 1.8183 |
| 11 | 3000 | 30 | 1959 | 3919 | 2.37 | 0.017 | −313 | 1.9025 |
| 12 | 3000 | 30 | 2200 | 4400 | | | −187 | 1.869 |
| 13 | 3000 | 30 | 1496 | 2992 | 2.37 | 0.469 | −311 | 1.8647 |
| 14 | 3000 | 30 | 1587 | 3175 | 2.48 | 0.057 | −592 | 2.0184 |
| 15 | 3000 | 30 | 2074 | 4148 | 2.46 | 0.012 | −90 | 1.9794 |
| 16 | 0 | 25 | 1516 | 3639 | 2.32 | 0.04 | −162 | 1.9408 |

TABLE V

| Sample # | % C | % H | % B |
|---|---|---|---|
| 10 | 46.1 | 24 | 29.9 |
| 11 | 31.8 | 23.5 | 44.7 |
| 12 | 27.5 | 22 | 50.5 |
| 13 | 63 | 19 | 18 |
| 14 | 36.5 | 19.5 | 44 |
| 15 | 29.5 | 17.5 | 53 |
| 16 | 35.5 | 23 | 41.5 |

TABLE V-continued

| Sample # | % C | % H | % B |
|---|---|---|---|

Figure 6:
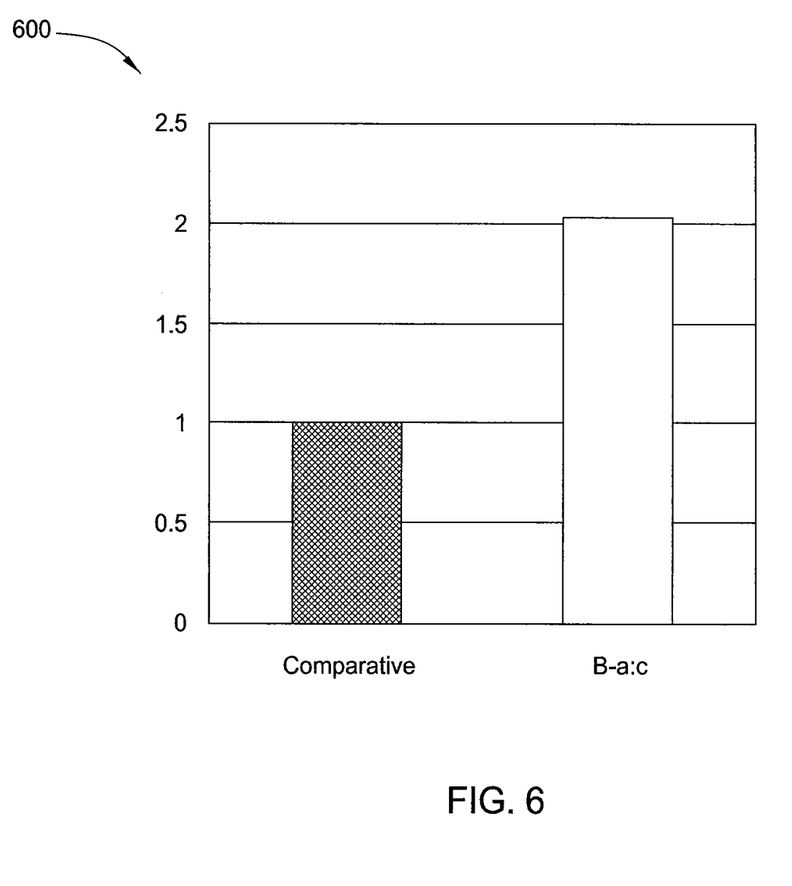
FIG. 6 is a plot depicting the blanket etch selectivity for a known undoped amorphous carbon film verses a boron containing amorphous carbon film deposited according to embodiments described herein.

FIG. 6 is a plot 600 depicting the etch selectivity for a known undoped amorphous carbon film verses a boron-containing amorphous carbon film deposited according to embodiments described herein. The y-axis depicts the blanket etch selectivity of each film deposited over an oxide. As depicted in FIG. 6, the B:a-c shows an improvement of two times the blanket etch selectivity of the comparative example.

Figure 7:
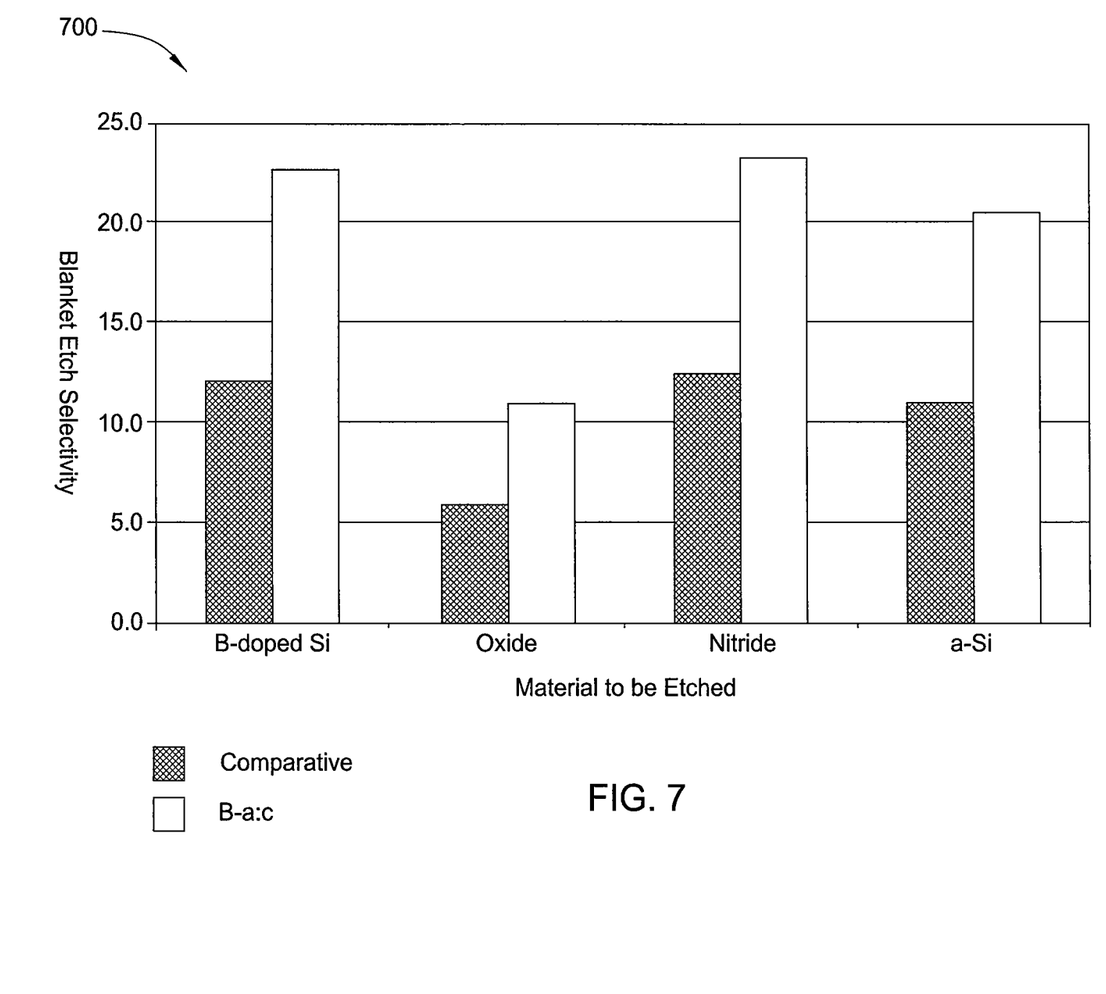
FIG. 7 is a plot depicting the blanket etch selectivity for a known undoped amorphous carbon film verses a boron containing amorphous carbon film deposited according to embodiments described herein.

FIG. 7 is a plot 700 depicting the blanket etch selectivity for a known undoped amorphous carbon film verses a boron-containing amorphous carbon film deposited according to embodiments described herein. The y-axis depicts the blanket etch selectivity of the known undoped amorphous carbon film verses the boron-containing amorphous carbon film. The x-axis depicts the material to be etched. As depicted in FIG. 7, the B:a-c shows an improvement of approximately two times the blanket etch selectivity of the comparative example for underlying materials including B-doped silicon, silicon oxide, silicon nitride, and amorphous-silicon (a-Si).

While the foregoing is directed to embodiments of the present invention, other and further embodiments of the invention may be devised without departing from the basic scope thereof, and the scope thereof is determined by the claims that follow.

The invention claimed is:

1. A method of processing a substrate in a processing chamber, comprising:
    exposing a substrate to a flow of a hydrocarbon-containing gas in the presence of RF power to deposit a boron-free amorphous carbon film on the substrate;
    turning off the RF power while continuing the flow of the hydrocarbon-containing gas; and
    exposing the substrate to a flow of a boron-containing gas and the flow of the hydrocarbon-containing gas in the presence of RF power to deposit a boron-containing amorphous carbon film on the boron-free amorphous carbon film, wherein the boron-containing amorphous carbon film contains from about 30 to 60 atomic percentage of boron.

2. The method of claim 1, wherein the boron-free amorphous carbon film has a thickness between about 50 Å and about 1000 Å.

3. The method of claim 1, wherein the boron-containing amorphous carbon film has a thickness between about 300 Å and about 5000 Å.

4. The method of claim 1, wherein the boron-containing amorphous carbon film contains from about 20 to about 50 atomic percentage of carbon.

5. The method of claim 1, wherein the boron-containing amorphous carbon film contains from about 10 to about 25 atomic percentage of hydrogen.

6. The method of claim 1, wherein the hydrocarbon-containing gas mixture comprises at least one hydrocarbon compound having a general formula $C_xH_y$, where x has a range of between 1 and 4 and y has a range of between 2 and 10.

7. The method of claim 6, wherein the hydrocarbon-containing gas mixture further comprises an inert and/or carrier gas selected from the group comprising argon, nitrogen, and helium.

8. The method of claim 7, wherein the boron-containing gas mixture comprises diborane ($B_2H_6$), trimethyl boron (TMB or $B(CH_3)_3$), triethylboron (TEB), methyl boron, dimethyl boron, ethyl boron, diethyl boron, or combinations thereof.

9. The method of claim 8, wherein the hydrocarbon compound is selected from the group comprising methane ($CH_4$), ethane ($C_2H_6$), ethylene ($C_2H_4$), propylene ($C_3H_6$), propyne ($C_3H_4$), propane ($C_3H_8$), butane ($C_4H_{10}$), butylene ($C_4H_8$) and its isomers, butadiene ($C_4H_6$), acetelyne ($C_2H_2$), and combinations thereof.

10. The method of claim 9, wherein the hydrocarbon compound is acetylene or propylene and the inert gas is helium and/or argon.

11. The method of claim 1, wherein the substrate comprises a plurality of alternating oxide and nitride materials, oxides alternating with amorphous silicon, oxides alternating with polysilicon, undoped silicon alternating with doped silicon, undoped polysilicon alternating with doped polysilicon, updoped amorphous silicon alternating with doped amorphous silicon, aluminum, tungsten, titanium nitride, copper, silicon oxide, silicon oxynitride, silicon nitride, and combinations thereof.

12. The method of claim 1, further comprising:
etching the boron-containing amorphous carbon film to form a patterned boron-containing amorphous carbon film; and
forming feature definitions in the substrate corresponding to the patterned boron-containing amorphous carbon film.

13. A method of processing a substrate in a processing chamber, comprising:
providing a substrate in a processing chamber;
flowing a hydrocarbon-containing gas mixture into the processing chamber;
generating a first plasma from the hydrocarbon-containing gas mixture to deposit a boron-free amorphous carbon film on the substrate, the boron-free amorphous carbon film having a thickness between about 300 Å and about 5000 Å;
stabilizing a processing condition within the processing chamber by turning off the first plasma while continuing the flow of the hydrocarbon-containing gas mixture into the processing chamber;
flowing a boron-containing gas mixture into the processing chamber; and
generating a second plasma from the hydrocarbon-containing gas mixture and the boron-containing gas mixture to deposit a boron-containing amorphous carbon film on the boron-free amorphous carbon film, the boron-containing amorphous carbon film having a thickness between about 300 Å and about 5000 Å.

14. The method of claim 13, wherein the boron-containing amorphous carbon film contains from about 10 to about 60 atomic percentage of boron.

15. The method of claim 13, further comprising:
removing the boron-containing amorphous carbon film using a solution comprising hydrogen peroxide and sulfuric acid; and
removing the boron-free amorphous carbon film using a hydrogen-containing plasma, an oxygen-containing plasma, or combinations thereof.

16. The method of claim 13, wherein the boron-containing amorphous carbon film contains from about 20 to about 50 atomic percentage of carbon.

17. The method of claim 13, wherein the boron-containing amorphous carbon film contains from about 10 to about 25 atomic percentage of hydrogen.

* * * * *